United States Patent
Casati et al.

[11] Patent Number: 6,002,173
[45] Date of Patent: Dec. 14, 1999

[54] SEMICONDUCTOR DEVICE PACKAGE WITH METAL-POLYMER JOINT OF CONTROLLED ROUGHNESS

[75] Inventors: Paolo Casati, Sesto San Giovanni-Milano; Pierangelo Magni, Villasanta; Giuseppe Marchisi, Milan, all of Italy

[73] Assignee: SGS-Thomson Microelectronics S.r.l., Agrate Brianza, Italy

[21] Appl. No.: 07/995,747

[22] Filed: Dec. 21, 1992

[30] Foreign Application Priority Data

Dec. 20, 1991 [IT] Italy ................... MI91A3441

[51] Int. Cl.⁶ .......................... H01L 23/48; H01L 23/28; H01L 23/10
[52] U.S. Cl. .......................... 257/739; 257/796; 257/706
[58] Field of Search .................. 257/739, 796, 257/706, 707, 676, 678, 668

[56] References Cited

U.S. PATENT DOCUMENTS

| | | | |
|---|---|---|---|
| 4,151,543 | 4/1979 | Hayakawa et al. | 257/668 |
| 5,041,902 | 8/1991 | McShane | 257/706 |
| 5,278,429 | 1/1994 | Tanenaka et al. | 257/678 |

FOREIGN PATENT DOCUMENTS

| | | | |
|---|---|---|---|
| 6029358 | 3/1981 | Japan . | |
| 57-096559 | 6/1982 | Japan . | |
| 58-153355 | 9/1983 | Japan | 257/796 |
| 9119749 | 7/1984 | Japan . | |
| 60-231349 | 11/1985 | Japan . | |
| 60-242649 | 12/1985 | Japan | 257/707 |
| 61-039554 | 2/1986 | Japan | 257/796 |
| 61-061445 | 3/1986 | Japan . | |
| 62-054947 | 3/1987 | Japan . | |
| 63-186454 | 8/1988 | Japan . | |
| 1067949 | 3/1989 | Japan . | |
| 1171257 | 7/1989 | Japan . | |
| 2018952 | 1/1990 | Japan . | |
| 3-234046 | 10/1991 | Japan | 257/796 |
| 3241767 | 10/1991 | Japan . | |

*Primary Examiner*—Teresa M. Arroyo
*Attorney, Agent, or Firm*—Allen, Dyer, Doppelt, Milbrath & Gilchrist, P.A.

[57] ABSTRACT

A structure is disclosed which comprises a metal plate, a chip of a semiconductor material attached to the plate, terminal leads, interconnection wires between the leads and the metallized regions of the chip, and a polymer body encapsulating all this with the exception of a surface of the plate and part of the leads. To achieve improved bond between the polymer and the metal, predetermined areas of the plate and the leads have a higher roughness than 1 ($R_a \geq 1$ $\mu$m).

19 Claims, 1 Drawing Sheet

SEMICONDUCTOR DEVICE PACKAGE WITH METAL-POLYMER JOINT OF CONTROLLED ROUGHNESS

BACKGROUND AND SUMMARY OF THE INVENTION

This invention relates to semiconductor electronic devices (particularly to a semiconductor electronic device structure which also includes a metal plate joined to a body of hardened resin), and to methods of making such device structures.

As is known, integrated circuits and other active electronic devices or components are formed on chips of a semiconductor material, having a surface area on the order of a few square millimeters, and require, for their connection to an external electric circuit, special supporting, enclosing and electric interconnection structures. A typical structure suited for the purpose basically comprises a polymer body enclosing a chip which is connected (by thin wires soldered to metallized regions specially provided on its surface) to corresponding electric conductors or terminal leads led out of the polymer body. With power integrated circuits (i.e. devices which are designed to operate on high currents and which are therefore liable to become heated to a significant extent), such structures also comprise a small metal plate through which a chip mounted thereon can transfer the heat generated during its operation to the environment.

In manufacturing the last-mentioned structures, the plate is blanked from sheet metal, e.g. copper, possibly along with other like plates which are held together by sections of the sheet metal adapted to be shorn off at a later processing stage; thereafter, the chip is secured on the metal plate either by soldering with a low-melt alloy such as a lead-tin alloy, or by cementing with a suitable adhesive such as an epoxy adhesive; a set of metal strips, intended to become the terminal leads for the device, are then blanked from thin sheet metal but still left joined to one another by interconnecting sections, and mounted to the plate in an electrically insulated manner therefrom; thin wires, usually of gold, are bonded, on the one side, to the metallized regions of the chip using a low-melt alloy, and on the other side, welded to the ends of the metal strips using a so-called "thermosonic" process wherein heat and ultra-sound are applied simultaneously; thereafter, the assembly is placed into a specially provided mold, into which a polymer material such as a thermosetting epoxy resin is then introduced in a liquefied state; on curing the resin, a structure is obtained which comprises a solid polymer body (of hardened resin) encapsulating the above-described elements excepting for one face of the metal plate and part of the metal strips, i.e. of the device terminal leads, and their interconnecting sections; the latter are then removed along with any interconnecting sections between plates (e.g. by blanking) to yield the finished electronic product.

A typical problem with the above-described structures is their low reliability from insufficient adhesion of the resin body to the metal parts. It has been verified that a large proportion of the failures occurring to such devices originates from moisture entering the body through interstices which result from separation of the hardened resin from some surface areas of the heat-sink plate and the terminal leads. This separation is to be attributed basically to shear forces developing between the metal and the polymer during the cooling step which follows the molding operation and during normal thermal cycles of operation owing to the difference between the thermal expansion coefficients of metal and polymer.

To solve this problem at least in part, a technique is known whereby the surface and/or edges of the heat-sink plate are machined to form grooves and/or undercut portions therein which can allow the liquefied resin to flow therealong during the injection molding operation, thereby providing not only improved anchoring of the polymer body on the plate but also improved imperviousness to moisture after the resin has cured. This expedient has proved effective to improve stability of the mechanical bond between the polymer body and the heat-sink plate, but has been less effective in reliably providing a hermetic seal: since the action of this expedient primarily affects the interface between the polymer and the heat sink, the seal across the polymer/leads interface is not improved.

The disclosed innovations advantageously provide a semiconductor electronic device structure (of the type which provides heat-sinking and encapsulation for the electronic device by use of a metal plate joined to a body of hardened resin) which can afford improved overall reliability, and moisture-tightness in particular.

This object is achieved, according to the invention, by the provision of a structure wherein the metal plate and/or the end portions of the terminal leads inside the polymer body exhibit a higher roughness of their surfaces in contact with the polymer body than 1 ($R_a$=1 $\mu$m). (The parameter $R_a$, which provides a quantitative measure of surface roughness, is conventionally defined as $$R_a = \frac{1}{x_2 - x_1} \int_{x_1}^{x_2} |y| dx$$

where y=f(x) is a function representing the profile of a surface to be measured at the intersection line of the surface with a plane perpendicular thereto and considered between two points $x_1$ and $x_2$. The unit of measure is the micron ($10^{-6}$ m).) This is preferably achieved by fabricating these metal elements using selectably roughened dies.

According to certain embodiments of the invention, there is provided: a method for fabricating packaged electronic device structures, comprising the steps of: affixing a chip, which contains one or more miniature electronic devices, to a metal plate of which substantial portions have a surface roughness greater than about $R_a$=1, and other portions have a surface roughness less than about $R_a$=1; attaching a lead frame to said plate, said lead frame comprising multiple flat metal strips joined in a substantially electrically continuous sheet, substantial portions of said lead frame having a surface roughness greater than about $R_a$=1; electrically connecting predetermined portions of said chip to leads of said lead frame; encapsulating said chip, said wires, portions of said plate, and portions of said lead frame in an insulating material; and trimming outer portions of said lead frame to provide electrically separated leads connected to said bond pads and which protrude from said body.

According to certain embodiments of the invention, there is provided: a method for fabricating packaged electronic device structures, comprising the steps of: blanking sheet metal, using a die which has at least some portions thereof artificially roughened, to produce a metal plate of which substantial portions have a surface roughness greater than about $R_a$=1, and other portions have a surface roughness less than about $R_a$=1; affixing a chip which contains one or more miniature electronic devices, and one or more electrical bond pads, to said metal plate; attaching a lead frame to said plate, said lead frame comprising multiple flat metal strips joined in a substantially electrically continuous sheet; bonding to form wire connections from said bond pads of said chip to leads of said lead frame; encapsulating said chip, said wires, portions of said plate, and portions of said lead frame in an insulating material; and trimming outer portions of said lead frame to provide electrically separated leads connected to said bond pads and which protrude from said body.

According to certain embodiments of the invention, there is provided: a method for fabricating packaged electronic device structures, comprising the steps of: blanking and coining sheet metal to produce a metal plate; blanking and coining sheet metal, using a die which has at least some portions thereof artificially roughened, to produce a metal lead frame of which substantial portions have a surface roughness greater than about $R_a=1$, said lead frame comprising multiple flat metal strips joined in a substantially electrically continuous sheet; attaching said lead frame to said plate, said lead frame comprising multiple flat metal strips joined in a substantially electrically continuous sheet; affixing a chip which contains one or more miniature electronic devices, and one or more electrical bond pads, to a metal plate; bonding to form wire connections from said bond pads of said chip to leads of said lead frame; encapsulating said chip, said wires, portions of said plate, and portions of said lead frame in an insulating material; and trimming outer portions of said lead frame to provide electrically separated leads connected to said bond pads and which protrude from said body.

According to certain embodiments of the invention, there is provided: a packaged electronic device structure, comprising: a plate of thermally and electrically conductive material; a microelectronic device chip having a first surface thereof electrically and thermally connected to said plate, and containing one or more miniature electronic devices and one or more bond pads on a second surface thereof; a plurality of externally accessible conductive leads, each having one end adjacent to said chip; wires interconnecting said leads to said bond pads of said chip; and a polymer body encapsulating said chip, and each of said wires, and at least part of said plate; wherein at least some portions of said plate have a surface roughness of greater than about $R_a=1$, and other portions have a surface roughness less than about $R_a=1$; and wherein at least some portions of said leads have a surface roughness of greater than about $R_a=1$.

According to certain embodiments of the invention, there is provided: a packaged electronic device structure, comprising: a plate of thermally and electrically conductive material; a microelectronic device chip electrically and thermally connected to said plate; a plurality of externally accessible conductive leads, each having one end adjacent to said chip; wires interconnecting said leads to said chip; and a polymer body encapsulating said chip, and each of said wires, and at least part of said plate; wherein at least some portions of said plate have a surface roughness of less than about $R_a=1$; and wherein at least some portions of said leads have a surface roughness of greater than about $R_a=1$.

According to certain embodiments of the invention, there is provided: a packaged electronic device structure, comprising: a plate of thermally and electrically conductive material; a microelectronic device chip electrically and thermally connected to said plate; a plurality of externally accessible conductive leads, each having one end adjacent to said chip; wires interconnecting said leads to said chip; and a polymer body encapsulating said chip, and each of said wires, and at least part of said plate; wherein some portions of said plate, including at least 5% of the surface area thereof, have a surface roughness of greater than about $R_a=1$, and other portions of said plate have a surface roughness of about $R_a=1$ or less.

According to certain embodiments of the invention, there is provided: a semiconductor device structure comprising a metal plate with support and heat dissipation functions, a chip of a semiconductor material attached to said plate, terminal leads for connection to external electric circuitry, and a polymer body encapsulating said metal plate to leave at least a surface portion thereof, said chip of semiconductor material, and end portions of said leads exposed, wherein at least predetermined areas, in contact with said polymer body, of said metal plate and said end portions of said leads exhibit a higher roughness than 1 ($R_a>1$ $\mu$m).

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit ay of the various claimed inventions. Moreover, some statements may apply to some inventive features but not to others.

In this sample embodiment, the semiconductor electronic device structure shown in the various Figures can be seen to comprise:

a polymer body, indicated at 10;
a multiplicity of metal strips or terminal leads 11;
a metal plate 12 made preferably of copper and serving support and heat dissipation functions; and
a chip 13 of a semiconductor material on which an integrated circuit has been formed and which is attached to the metal plate by a layer of a soldering alloy 14.

Figure 2:
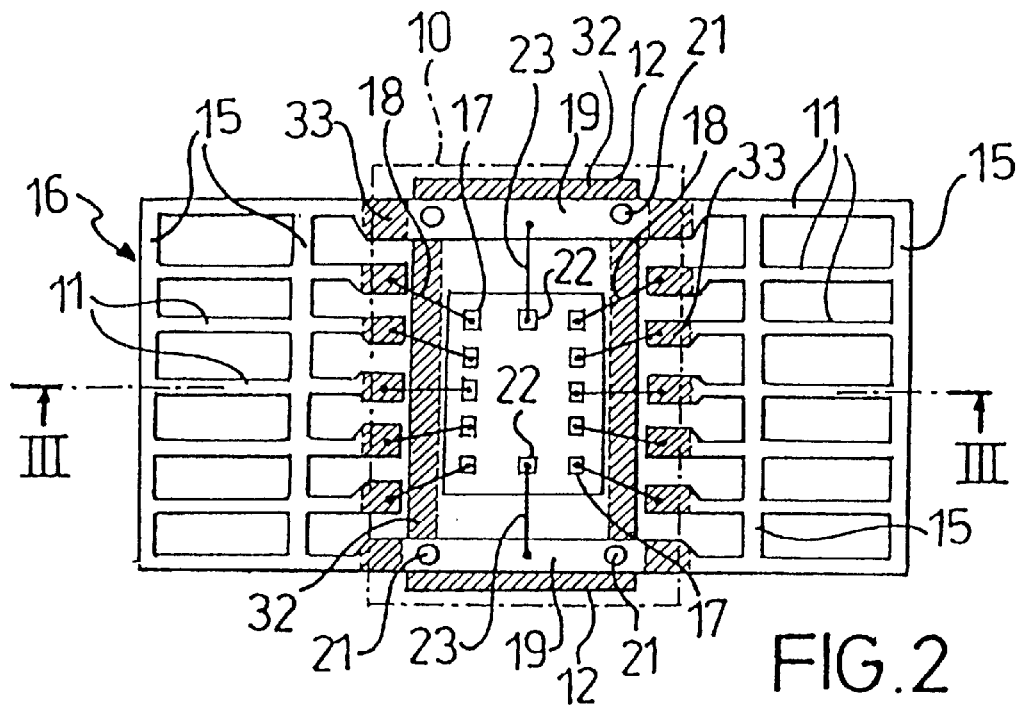
FIG. 2 is a plan view of the structure shown in FIG. 1, as it appears before the molding step.
Figure 3:
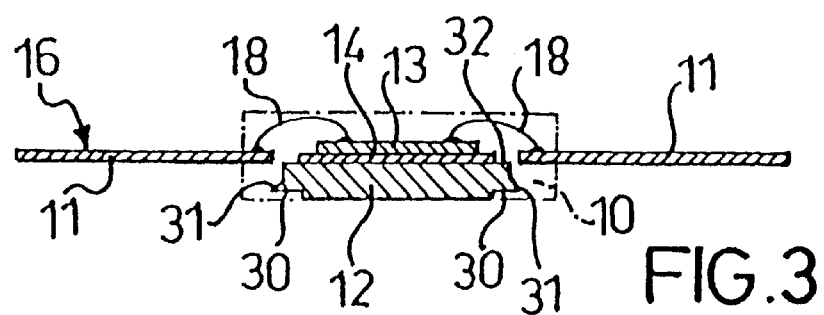
FIG. 3 is a sectional view, taken along line III—III in FIG. 2.

The terminal leads 11 are, as customary, blanked from a single piece of sheet metal. Until they are separated from one another after molding (preferably also by a blanking method), they are joined together by interconnecting sections 15 into a framework, generally indicated at 16, as shown in FIG. 2.

The metal plates 12 are also blanked, as customary, individually from a single metal sheet, or alternatively along with a number of like plates which are left joined to one another by short interconnecting sections adapted to be removed at a later stage, either by shearing or otherwise, after the simultaneous formation of the polymer bodies in a single mold.

The lead ends within the framework 16 are connected, in the conventional manner described above, to the metallized regions 17 of the chip by means of thin gold wires 18.

In the presently preferred embodiment, the framework 16 has two opposed side strips forming two rods 19 inside the polymer body. Each rod 19 has two holes 20 which enable the framework 16 to be mounted on the plate 12 with the aid of special studs 21 standing proud of the plate. After passing the studs 21 through the holes 20, the studs are riveted to secure the rods 19 and the whole framework 16 in place. Two metallized regions 22 of the chip 13, which correspond to the electric ground terminal of the integrated circuit, are connected, by respective thin golden wires 23, to the rods 19 in intermediate areas between supporting studs. However, it should be appreciated that, while this feature is used in the best mode of the invention as presently contemplated, it is not strictly necessary to the claimed inventions.

Figure 1:
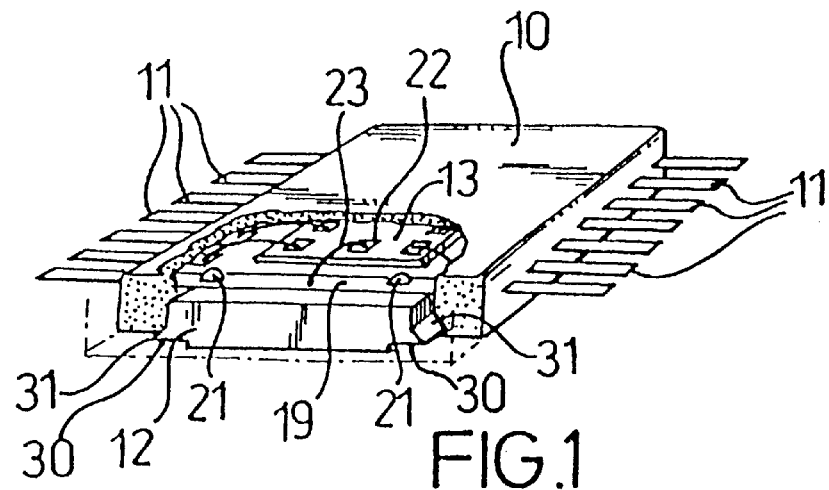
FIG. 1 is a perspective view of a structure according to the invention cut-away to show its interior.

Following conventional formation of the polymer body 10 and shearing off the interconnecting sections 15 of the framework 16, the structure shown in FIG. 1 is obtained.

To improve the bond between the polymer body 10 and the metal plate 12, in accordance with conventional technique, the latter is shaped around its periphery to have undercut surfaces, indicated at 30, and an acute-angle side projection, indicated at 31, substantially all around its periphery. To simplify the drawing, the undercut surfaces have been shown, in FIG. 1, only at the long sides of the plate. The undercut surfaces 30 and projections 31 may be conveniently formed as by coining simultaneously with the plate blanking operation, using a correspondingly patterned die and punch combination for the cutter machine.

For an even better bond, the plate 12 may be provided with surface deformations, such as channels having partly undercut side surfaces.

In accordance with conventional techniques, the sheet from which the heat-sink plates are formed and the sheet from which the terminal leads are formed have both a high degree of surface finish, i.e. have a very low amount of roughness, e.g. lower than 0.1 ($R_a$<0.1 $\mu$m), and are cut using dies with a correspondingly high degree of finish.

According to the invention, on the other hand, at least some areas of the plate and the leads exhibit an amount of roughness in excess of 1 ($R_a$>1 $\mu$m), preferably one within the range of 1.5 to 3.5 $\mu$m.

In the example shown in the drawing, such controlled roughness areas are peripheral areas of the plate 12, specifically those defined by the undercut surface 30 and the edge 32 facing said surface on the upper side, as illustrated by hatched portions in FIG. 2, and areas 33 of the enlarged end portions, partly encapsulated within the body 10, of the leads 11, also shown hatched in FIG. 2 on either sides. According to the invention, the roughness is created in these areas through the use, for blanking and coining the heat-sink plates and the lead frameworks, of dies provided with coining surfaces adapted to contact the aforementioned areas so as to define their surface condition, machined to have the amount of roughness sought for the surfaces being processed.

To obtain accurately controlled results, these coining surfaces may be conveniently provided by controlled thermal etching or sandblasting starting, of course, with high surface finish surfaces. (In service, the rough surfaces of the dies have to be periodically restored, as the dies wear.)

Dimensions for a sample embodiment are, for example: metal plate 12: 7.5×16×3.2 mm; chip 13: 6×8 mm; undercut 30: 0.9 mm each side; side projections 31: 0.3 mm; edge 32: 0.7 mm each side.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

While a single embodiment of this invention has been described and illustrated, it is understood that many variations and modifications are feasible within the scope of this inventive concept. As an example, rather than having the controlled roughness restricted to just some areas of the plate and the leads, it might be convenient in some cases to have the roughness control process extended to the whole of their surfaces.

Optionally, roughening can be applied to fractions of the surface different from that shown in the sample embodiments, or in patterns different from that shown in the sample embodiments. Some considerations relevant to such modifications are:

1) Roughening all surfaces of the heat sink plate is generally less advantageous, since the chip can be attached more efficiently to a smooth surface.
2) Roughening of the edge portions is generally more effective than roughening the inner portions.
3) Roughness is advantageous at the interface with plastics. This advantage is maximized when all metal-plastics interfaces are roughened.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A packaged electronic device structure, comprising:
   a plate of thermally and electrically conductive material;
   a microelectronic device chip having a first surface thereof electrically and thermally connected to said plate, and containing one or more miniature electronic devices and one or more bond pads on a second surface thereof;
   a plurality of externally accessible conductive leads, each having one end adjacent to said chip, said leads being thinner than said plate;
   wires interconnecting said leads to said bond pads of said chip; and
   a polymer body encapsulating said chip, and each of said wires, and at least part of said plate;
   wherein at least some portions of said plate have a surface roughness of greater than $R_a$=1 $\mu$m, and other portions have a surface roughness less than $R_a$=1 $\mu$m;
   wherein at least some portions of said leads have a surface roughness of greater than $R_a$=1 $\mu$m; and
   wherein said plate has undercut surfaces in predetermined areas which contact said polymer body to enhance adhesion thereof to said plate, and wherein said undercut surfaces include areas with roughness $R_a$ greater than 1 $\mu$m.

2. The structure of claim 1, wherein said plate consists essentially of copper.

3. The structure of claim 1, wherein at least some areas of said plate have a roughness in the range of 1.5 $\mu$m $\leq R_a \leq$ 3.5 $\mu$m.

4. The structure of claim 1, wherein said plate comprises angular coined edges, in proximity to said second surface, which have a surface roughness greater than $R_a$=1 $\mu$m.

5. The structure of claim 1 wherein at least some portions of said leads have a surface roughness of $R_a$=1 $\mu$m or greater, and other portions of said leads have a surface roughness of $R_a=1$ μm or less.

6. A packaged electronic device structure, comprising:
a plate of thermally and electrically conductive material;
a microelectronic device chip electrically and thermally connected to said plate;
a plurality of externally accessible conductive leads, each having one end adjacent to said chip;
wires interconnecting said leads to said chip; and
a polymer body encapsulating said chip, and each of said wires, and part of said plate except for one face thereof;
wherein at least some portions of said plate have a surface roughness of less than $R_a=1$ μm;
wherein at least some portions of said leads have a surface roughness of greater than $R_a=1$ μm; and
wherein said plate has undercut surfaces in predetermined areas which contact said polymer body to enhance adhesion thereof to said plate, and wherein said undercut surfaces include areas with roughness $R_a$ greater than 1 μm.

7. The structure of claim 6, wherein said plate consists essentially of copper.

8. The structure of claim 6, wherein at least some other areas of said plate have a roughness in the range of $1.5 \mu m \leq R_a \leq 3.5 \mu m$.

9. The structure of claim 6, wherein at least some areas of said leads have a roughness in the range of $1.5 \mu m \leq R_a \leq 3.5 \mu m$.

10. The structure of claim 6, wherein at least some portions of said leads have a surface roughness of $R_a=1$ μm or greater, and other portions of said leads have a surface roughness of $R_a=1$ μm or less.

11. A packaged electronic device structure, comprising:
a plate of thermally and electrically conductive material;
a microelectronic device chip electrically and thermally connected to said plate;
a plurality of externally accessible conductive leads, each having one end adjacent to said chip, said leads being thinner than said plate;
wires interconnecting said leads to said chip; and
a polymer body encapsulating said chip, and each of said wires, and at least part of said plate;
wherein some portions of said plate, including at least 5% of the surface area thereof, have a surface roughness of greater than $R_a=1$ μm, and other portions of said plate have a surface roughness of $R_a=1$ μm or less;
wherein said plate has undercut surfaces in predetermined areas which contact said polymer body to enhance adhesion thereof to said plate, and wherein said undercut surfaces include areas with roughness $R_a$ greater than 1 μm.

12. The structure of claim 11, wherein said plate consists essentially of copper.

13. The structure of claim 11, wherein at least some areas of said plate have a roughness in the range of $1.5 \mu m \leq R_a \leq 3.5 \mu m$.

14. The structure of claim 11, wherein said plate comprises angular coined edges which have a surface roughness $R_a$ greater than $R_a=1$ μm.

15. A semiconductor device structure comprising
a metal plate with support and heat dissipation functions,
a chip of a semiconductor material attached to said plate,
terminal leads for connection to external electric circuitry, said leads being thinner than said plate, and
a polymer body encapsulating said metal plate, said chip of semiconductor material, and said leads to leave at least a surface portion of said plate and end portions of said leads exposed,
wherein at least predetermined areas, in contact with said polymer body, of said metal plate and said end portions of said leads exhibit a roughness greater than 1 ($R_a>1$ μm); and
wherein said plate has undercut surfaces in predetermined areas contacting said polymer body to enhance adhesion thereof to said plate, and wherein said undercut surfaces include areas with roughness $R_a$ greater than 1 μm.

16. A structure according to claim 15, wherein said plate has undercut surfaces in predetermined areas contacting said polymer body to enhance said bond thereof to said plate, and wherein said undercut surfaces include areas with roughness $R_a$ greater than 1 μm.

17. The structure of claim 15, wherein said plate consists essentially of copper.

18. The structure of claim 15, wherein at least some areas of said plate have a roughness $R_a$ in the range of 1.5 μm to 3.5 μm inclusive.

19. The structure of claim 15, wherein at least some portions of said leads have a surface roughness of $R_a=1$ μm or greater, and other portions of said leads have a surface roughness of $R_a=1$ μm or less.

* * * * *